United States Patent
Roof et al.

(10) Patent No.: US 12,167,550 B2
(45) Date of Patent: Dec. 10, 2024

(54) DISCONNECT DEFEATER ARM MECHANISM

(71) Applicant: Hoffman Enclosures Inc., Anoka, MN (US)

(72) Inventors: Kevin Roof, St. Louis Park, MN (US); William Anderson, Blaine, MN (US)

(73) Assignee: Hoffman Enclosures Inc., Anoka, MN (US)

( * ) Notice: Subject to any disclaimer, the term of this patent is extended or adjusted under 35 U.S.C. 154(b) by 397 days.

(21) Appl. No.: 17/743,796

(22) Filed: May 13, 2022

(65) Prior Publication Data

US 2022/0369479 A1    Nov. 17, 2022

Related U.S. Application Data

(60) Provisional application No. 63/188,867, filed on May 14, 2021.

(51) Int. Cl.
*H05K 5/02* (2006.01)
*E05C 3/14* (2006.01)

(52) U.S. Cl.
CPC ............. *H05K 5/0208* (2013.01); *E05C 3/14* (2013.01)

(58) Field of Classification Search
CPC ......... H05K 5/0208; E05C 3/14; E05C 3/122; E05C 9/043; E05C 9/048; H01H 3/3031; H01H 9/22; H01H 9/226; H02B 1/38; H02B 1/30
USPC ........... 200/50.02–50.5, 50.12, 50.15–50.16, 200/50.18–50.19; 361/679.04; 292/285; 307/112; 312/234.1, 223.6
See application file for complete search history.

(56) References Cited

U.S. PATENT DOCUMENTS

| | | |
|---|---|---|
| 2,937,254 A | 5/1960 | Ericson |
| 3,134,877 A | 5/1964 | Ericson |
| 3,141,074 A | 7/1964 | Rexroad |
| 3,229,056 A | 1/1966 | Turnbull |
| 3,534,186 A | 10/1970 | Meyer |
| 3,882,291 A | 5/1975 | Chiboroski |
| 4,034,169 A | 7/1977 | Armstrong et al. |
| 4,104,491 A | 8/1978 | Duble |

(Continued)

FOREIGN PATENT DOCUMENTS

| | | |
|---|---|---|
| CN | 206451999 U | 8/2017 |
| CN | 111600206 A | 8/2020 |

(Continued)

*Primary Examiner* — William A Bolton
(74) *Attorney, Agent, or Firm* — Quarles & Brady LLP

(57) ABSTRACT

An interlock system for an enclosure can include a power switch movable between an OFF position and an ON position with a defeater arm coupled to the power switch. The defeater arm can be selectively movable between a locked position and an unlocked position and when the defeater arm is in the locked position the power switch is prevented from moving from the OFF position to the ON position. An interlock can include a pivot bracket pivotally supported by a support bracket within the interior of the enclosure and movable between a first orientation, in which the pivot bracket is out of engagement with the defeater arm, and a second orientation, in which the pivot bracket displaces the defeater arm into the unlocked position. When the door is moved into a closed position from an open position, a door bracket displaces the pivot bracket into the second orientation.

20 Claims, 3 Drawing Sheets

(56) References Cited

U.S. PATENT DOCUMENTS

| | | |
|---|---|---|
| 4,118,607 A | 10/1978 | Shaffer |
| 4,448,450 A | 5/1984 | Kleinecke et al. |
| 4,764,648 A | 4/1988 | Resh |
| 6,545,859 B2 | 4/2003 | Leccia |
| 6,642,463 B1 | 11/2003 | Turner |
| 6,998,549 B1 | 2/2006 | Bender et al. |
| 7,168,745 B2 | 1/2007 | Jamnia et al. |
| 7,405,369 B2 | 7/2008 | Mukharzi et al. |
| 7,478,101 B1 | 1/2009 | Manley |
| 7,724,507 B2 | 5/2010 | Whitt et al. |
| 8,020,950 B2 | 9/2011 | Reuter et al. |
| 8,076,598 B2 | 12/2011 | Billard et al. |
| 8,419,141 B2 * | 4/2013 | Niedzwiecki ......... E05C 9/1808 312/216 |
| 8,902,570 B2 | 12/2014 | Cosley et al. |
| 9,554,480 B2 | 1/2017 | Freeman |
| 9,852,567 B2 * | 12/2017 | Hild ................... G06Q 10/0836 |
| 9,879,446 B2 * | 1/2018 | Robinson ................. H02B 1/38 |
| 9,922,785 B2 | 3/2018 | Jur et al. |
| 10,212,839 B2 | 2/2019 | Kuzniak et al. |
| 10,309,127 B2 * | 6/2019 | Root ........................ E05C 3/08 |
| 10,373,780 B2 | 8/2019 | Jur et al. |
| 10,530,133 B2 | 1/2020 | Kuzniak et al. |
| 10,811,853 B2 | 10/2020 | Rogers et al. |
| 10,954,695 B2 * | 3/2021 | Anderson ............. E05B 63/185 |
| 2013/0256102 A1 * | 10/2013 | Hager ..................... E05C 1/08 292/138 |
| 2020/0153209 A1 | 5/2020 | Kuzniak et al. |
| 2020/0270907 A1 | 8/2020 | Zeitler |
| 2020/0318398 A1 * | 10/2020 | Underwood ........... E05B 77/14 |

FOREIGN PATENT DOCUMENTS

| | | |
|---|---|---|
| CN | 211350458 U | 8/2020 |
| DE | 20201410297 U1 | 10/2015 |
| EP | 3518359 A1 | 7/2019 |
| TW | M366229 U | 10/2009 |
| WO | 2008/087723 A1 | 7/2008 |

* cited by examiner

DISCONNECT DEFEATER ARM MECHANISM

RELATED APPLICATIONS

This application is based on, claims priority to, and incorporates herein by reference in its entirety, U.S. Provisional Patent Application No. 63/188,867, filed on May 14, 2021, and entitled "Disconnect Defeater Arm Mechanism".

BACKGROUND

Electrical equipment can be installed in enclosures with doors to allow users to access the equipment. In some installations, it may be useful to selectively prevent a door of an enclosure from being opened. For example, in some installations, it may be useful to prevent a door, or multiple doors, from being opened unless power to the enclosure has been appropriately disconnected.

SUMMARY

In some embodiments, an interlock system is provided for controlling doors that are movable to provide access to an interior of an enclosure. The interlock system includes a power switch movable between an OFF position and an ON position and a defeater arm coupled to the power switch. The defeater arm extends within the interior of the enclosure and is selectively movable between a locked position and an unlocked position. When the defeater arm is in the locked position the power switch is prevented from moving from the OFF position to the ON position. The interlock system also includes a support bracket, a door bracket, and a pivot bracket. The support bracket is within the interior of the enclosure. The door bracket is coupled to the door of the enclosure and includes a hook. The pivot bracket is pivotally supported by the support bracket and is movable between a first orientation, in which a first arm of the pivot bracket is out of engagement with the defeater arm, and a second orientation, in which the first arm of the pivot bracket displaces the defeater arm into the unlocked position. When the door is moved into a closed position from an open position, the door bracket displaces the pivot bracket into the second orientation via engagement between the door bracket and a second arm of the pivot bracket.

In some embodiments, an interlock system for an enclosure including a door movable to provide access to an interior of the enclosure is provided. The interlock system includes a power switch movable between an OFF position and an ON position and a defeater arm coupled to the power switch. The defeater arm extends into the interior of the enclosure and is selectively movable between a locked position and an unlocked position. When the defeater arm is in the locked position the power switch is prevented from moving from the OFF position to the ON position. The interlock system further includes a first bracket and a second bracket. The first bracket is pivotally secured within the interior of the enclosure. The second bracket is coupled to the door of the enclosure and includes a hook and an engagement arm. When the door is in a closed position, the engagement arm of the second bracket engages the first bracket such that the first bracket is pivoted to hold the defeater arm in the unlocked position. When power switch is in the ON position and the door is moved from the closed position to an open position, the engagement arm permits the first bracket to pivot such that the defeater arm moves to be engaged by the hook.

In some embodiments, a method of controlling access to an interior of an enclosure having powered electrical components in the interior that are accessible by a door is provided. The method includes moving the door to a closed position so that a first bracket that is pivotally secured within the interior of the enclosure is pivoted in a first direction by an engagement arm of a second bracket coupled to the door, to hold in an unlocked position a defeater arm that is coupled to a power switch that is movable between an OFF position and an ON position, the defeater arm extending into the interior of the enclosure and being movable between a locked position, in which the power switch is prevented from moving from the OFF position to the ON position, and the unlocked position, in which the power switch is permitted to move from the OFF position to the ON position. The method further includes moving the power switch to the ON position, with the door in the closed position, and, with the power switch in the ON position, moving the door from the closed position towards an open position, such that the defeater arm moves to be engaged by a hook of the second bracket to prevent the door from moving to the open position.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
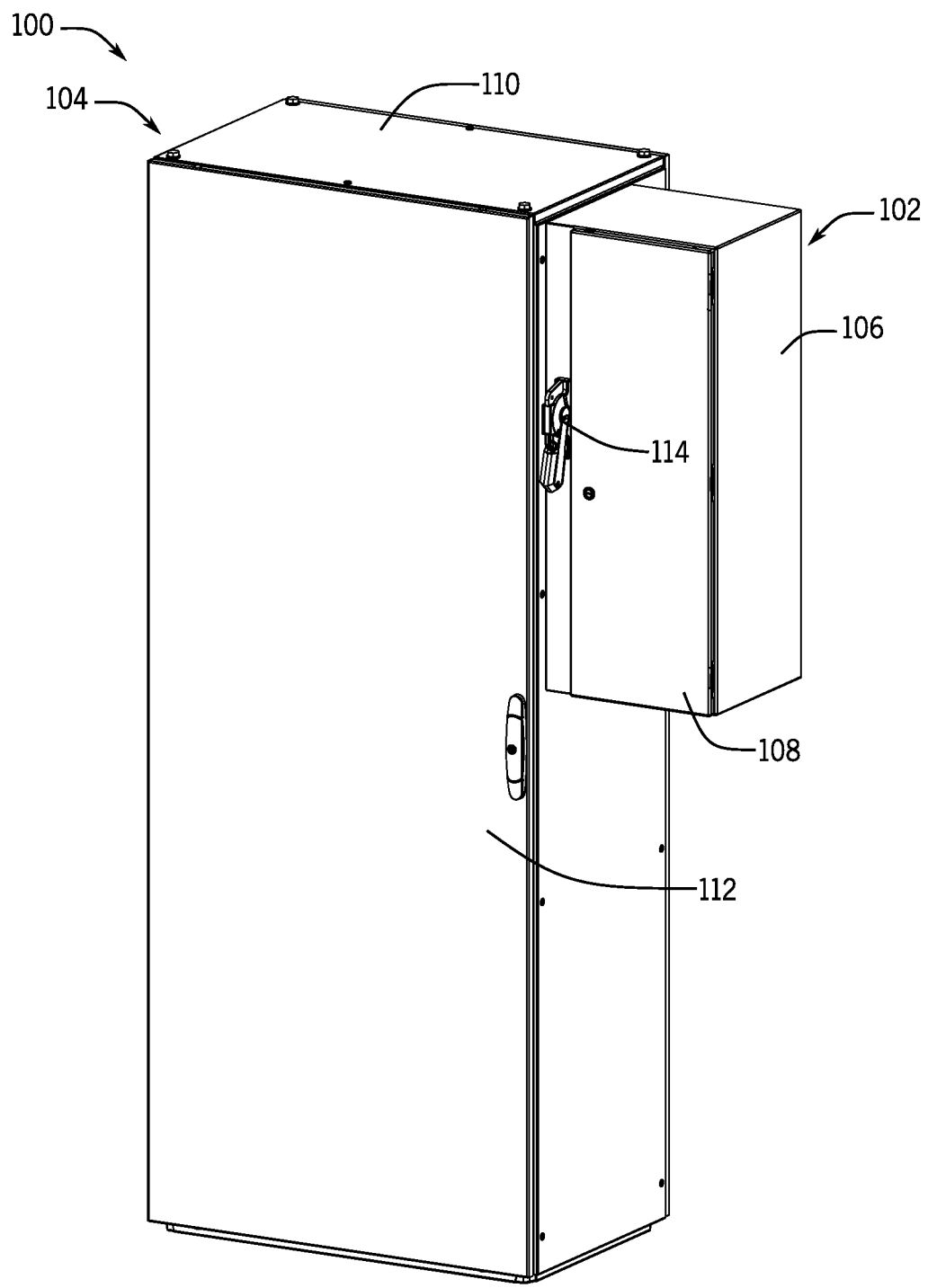
FIG. 1 is an isometric view of an enclosure assembly for use with an interlock according to an embodiment of the invention.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As used herein, unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings. As also used herein, unless specified or limited otherwise, the terms "approximately" and "substantially" and variations thereof, when used relative to a numerical value, define a range of values within 20% of the numerical value (e.g., within 15%, 10%, or within 5%). Similarly, unless otherwise specified or limited, "approximately" and "substantially" and variations thereof, when used relative to parallel or perpendicular extension relative to a reference direction, indicates a direction within 15 degrees of the reference direction.

In some implementations, devices or systems disclosed herein can be utilized, manufactured, or installed using methods embodying aspects of the invention. Correspondingly, any description herein of particular features, capabilities, or intended purposes of a device or system is generally intended to include disclosure of a method of using such devices for the intended purposes, of a method of otherwise implementing such capabilities, of a method of manufacturing relevant components of such a device or system (or the device or system as a whole), and of a method of installing disclosed (or otherwise known) components to support such purposes or capabilities. Similarly, unless otherwise indicated or limited, discussion herein of any method of manufacturing or using for a particular device or system, including installing the device or system, is intended to inherently include disclosure, as embodiments of the invention, of the utilized features and implemented capabilities of such device or system.

It may sometimes be useful to link operation of a power disconnect switch with doors of an enclosure (e.g., of an electrical enclosure) so that one or more doors not be opened unless power to the enclosure has been properly disconnected. This may be useful, for example, in enclosures in which power is to be disconnected before operators conduct work within the enclosures. In some cases, it may be useful to ensure that certain (e.g., all) doors cannot be opened while the enclosure is energized.

In conventional interlock mechanisms, a ramped surface/bracket is used to engage a defeater arm that is configured to allow/prevent a power switch from being actuated or to help to prevent/allow a door to be opened. However, the deflection of the defeater arm can make these ramped surface interlock mechanisms unreliable. For example, with a sufficiently large length, a defeater arm can be susceptible to bending at the end engaged by the interlock mechanism, which can prevent the defeater arm from reliably operating.

Generally, the present disclosure provides an improved interlock mechanism for enclosures. In particular, the present disclosure generally provides systems and methods for a rotating or pivoting bracket that receives feedback from a door position such that the pivoting bracket is configured to reliably hold the defeater arm in a desired state or to reliably permit the defeater arm to appropriately move, depending on the state of the door and of a power disconnect switch.

For example, some embodiments of the invention can include (or be configured for use with) an external power switch movable between an "OFF" position and an "ON" position, and a defeater arm coupled to the power switch. The defeater arm can extend within an interior of an enclosure and be selectively movable between a locked position and an unlocked position. When the defeater arm is in the locked position, the power switch is prevented from moving from the OFF position to the ON position. Further, according to some embodiments, when a door of the enclosure is in a closed position, an interlock mechanism engages the defeater arm to hold the defeater arm in the unlocked position such that, when power switch is in the ON position and the door is moved from the closed position to an open position, the interlock mechanism prevents the door from being opened. In that way, access to the enclosure can be prevented while power is applied to the electrical components within the enclosure.

FIG. 1 illustrates an enclosure 100 that can be equipped with an interlock according to an embodiment of the invention. In the illustrated embodiment, the enclosure 100 is configured as an enclosure assembly including a power enclosure 102 and a control enclosure 104 (e.g., a main enclosure). The power enclosure 102 can be coupled to the control enclosure 104 and be configured to enclose components for controlling incoming power, such as fuses, disconnects, etc. The control enclosure 104 can be configured to enclose electrical components receiving power from the power enclosure 102. In the illustrated embodiment, only a single control enclosure 104 is illustrated. However, the enclosure 100 can include a plurality of control enclosures (e.g., a plurality of bays) or other generally known configurations.

Continuing relative to the illustrated embodiment, the control enclosure 104 can include a control cabinet 110 and a control door 112 movable between an open position (not shown) and a closed position to provide access to components within the control enclosure 104. Similarly, the power enclosure 102 can include a power cabinet 106 and a power door 108 movable between an open position (not shown) and a closed position to provide access to components within the power enclosure 102.

A power switch 114 (e.g., a power disconnect) is provided for the power enclosure 102, and is configured to be movable between an "OFF" position, in which power is disconnected from the control enclosure 104, and an "ON" position, in which power is applied to the control enclosure 104. The power switch 114 can generally prevent the power door 108 from being opened unless the power enclosure 102 is appropriately de-energized via selective actuation of the power switch 114. As will be described herein, the control enclosure 104 can include an interlock mechanism configured to selectively provide or inhibit access to the control enclosure 104 via the control door 112 based on a position of the power switch 114. Further, a position of the control door 112 can provide feedback to the interlock mechanism, which in turn selectively actuates a defeater arm configured to lock or unlock the power switch 114.

Figure 2:
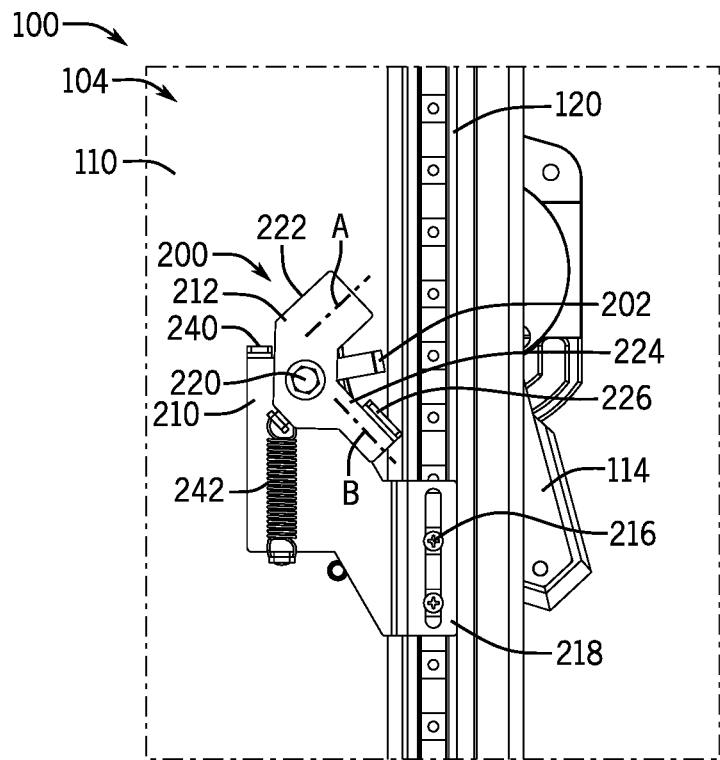
FIG. 2 is an internal view of an interlock for use with the enclosure assembly of FIG. 1 with a power switch in an OFF position and a door of the enclosure in an open position.
Figure 3:
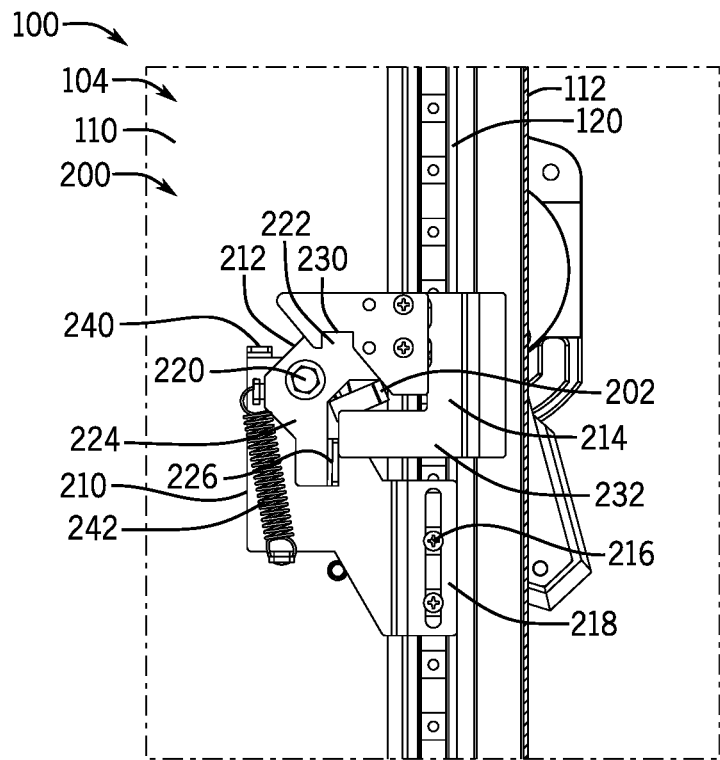
FIG. 3 is an interval view of the interlock of FIG. 2 with the door of the enclosure in a closed position.

FIGS. 2 and 3 show internal views of an interlock system 200 within an interior of the control enclosure 104. The interlock system includes a defeater arm 202 extending into and within an interior of the control enclosure 104. In the illustrated embodiment, the defeater arm 202 extends from an interior of the power enclosure 102 into the interior of the control enclosure 104, although other configurations are possible, including longer and shorter lengths of the defeater arm 202. The defeater arm 202 is selectively movable between a locked position (FIG. 2) and an unlocked position (FIG. 3) to prevent or allow actuation of the power switch 114, respectively, based on a position of the defeater arm 202. More specifically, the defeater arm 202 is operatively coupled to the power switch 114 and when the defeater arm 202 is in the locked position, the power switch 114 is prevented (e.g., locked) from moving from the OFF position to the ON position. This can be beneficial, for example, for preventing power from being applied to the control enclosure 104 when the door 112 is open or being worked in by a technician. According to some embodiments, the defeater arm 202 is spring biased towards the locked position when the power switch 114 is in the ON position. Additionally or alternatively, according to some embodiments the defeater arm 202 is spring biased towards the unlocked position when the power switch 114 is in the OFF position.

The interlock system includes a support bracket 210, a pivot bracket 212, and a door bracket 214. The support bracket 210 can be coupled to an interior of the control enclosure 104 and configured to pivotally support the pivot bracket 212 relative to a frame of the control enclosure 104. In the illustrated embodiment, the support bracket 210 is coupled to a main frame 120 of the control enclosure 104 adjacent to the door opening, with one or more fasteners 216, although other configurations are possible. Also in the illustrated embodiment, the support bracket includes a slot 218 receiving the one or more fasteners 216. The slot 218 is configured to allow the support bracket 210 to be adjusted vertically along the main frame 120.

As noted generally above, other support arrangements for a support bracket are possible. According to some embodiments, the support bracket 210 can be integrally formed into the sidewalls of the control enclosure. According to other embodiments, the support bracket 210 can be integrally formed into the main frame of the control enclosure. According to the illustrated embodiment, the support bracket 210 is configured as a bracket removably coupled to the main frame 120 of the control enclosure 104.

The pivot bracket 212 is pivotally supported by the support bracket 210 at a pivot point 220. Generally, the pivot bracket 212 is configured to receive feedback from a position of the door 112, via the door bracket 214, to selectively engage (and move) the defeater arm 202 between the locked position (FIG. 2) and the unlocked position (FIG. 3).

Although a variety of configurations are possible for a pivot bracket, a generally V- or C-shaped profile can be useful in some cases. In this regard, for example, the pivot bracket includes a first arm 222 and a second arm 224. The first arm 222 extends away from the pivot point 220 along a first generally elongate direction A (see FIG. 2). The second arm 224 extends away from the pivot point 220 along a second generally elongate direction B (see FIG. 2). In the illustrated embodiment, the first arm 222 is approximately orthogonal (i.e., within ±5 degrees of 90 degrees) to the second arm 224 as measured relative to elongate directions A and B. According to other embodiments, the first and second arms 222, 224 may define an angle (e.g., between the elongate directions A and B) that is more or less than 90 degrees.

As further discussed below, the first arm 222 is configured to engage the defeater arm 202 and the second arm 224 is configured to be engaged by the door bracket 214. In the illustrated embodiment, a distal end of the second arm 224 correspondingly includes an end plate 226 that provides a larger contact area (e.g., a contact surface) to engage the door bracket 214. However, other configurations are possible, including configurations with particular geometry relative to the relevant door bracket (e.g., with concave surfaces, complementary curvature, geometrically similar shapes, etc.)

The door bracket 214 is coupled to the door 112 and is configured to selectively position the pivot bracket 212 between a first orientation (FIG. 2) and a second orientation (FIG. 3), based on the position of the door 112. This selective positioning via the door bracket 214 in turn can cause the pivot bracket to move the defeater arm 202 between the locked/unlocked positions (e.g., by direct contact with the pivot bracket 212, in the illustrated embodiment).

Generally, a door bracket can also include an engagement feature that is configured to engage a defeater arm and thereby help to lock the door against opening when power is connected. For example, the door bracket 214 includes a hook portion 230 and an engagement arm 232 that extend in parallel at offset vertical locations relative to the door 112. That is, the hook portion 230 is at a first vertical location relative to the door 112 and the engagement arm 232 is at a second vertical location relative to the door 112 that is vertically offset from the first vertical location, thereby creating a gap between the hook portion 230 and the engagement arm 232 to receive the defeater arm 202. In the illustrated embodiment, the hook portion 230 is vertically above the engagement arm 232 (e.g., from the perspective of FIG. 3).

As will be further described below, the hook portion 230 is configured to receive and catch the defeater arm 202 to lock the door 112 against opening. In contrast, the engagement arm 232 is configured to engage the end plate 226 of the pivot bracket 212 to move the pivot bracket 212 relative to the support bracket 210. In the illustrated embodiment, the door bracket 214 includes a first bracket including the hook portion 230, and a second bracket coupled to the first bracket and including the engagement arm 232. According to some embodiments, the hook portion 230 and the engagement arm 232 can be integrally formed into a unitary bracket component.

In the illustrated embodiment, the door bracket 214 can be coupled to the door 112 with one or more fasteners. In the illustrated embodiment, the door bracket 214 can include a slot for receiving the one or more fasteners. The slot is configured to allow the door bracket 214 to be adjusted vertically along relative to the door 112. Generally, however, a door bracket can be attached to or formed with a door using any variety of known approaches for securing rigid bodies together.

As noted above, the pivot bracket 212 is movable between a first orientation (FIG. 2) and a second orientation (FIG. 3). In the first orientation, the door 112 of the control enclosure 104 is open and the pivot bracket 212 is out of engagement with the defeater arm 202, thereby allowing the defeater arm 202 to be in the locked position. Correspondingly, the defeater arm 202 can prevent the enclosure 100 from being energized while the door 112 is open.

In some cases, movement of a pivot bracket can be bounded or biased via features separate from a door or door bracket. For example, while in the first orientation, the pivot bracket 212 can be in contact with a tab 240 formed into an upper end of the support bracket 210. The tab 240 can define an end stop for the pivot bracket 212. As another example, in the illustrated embodiment, the pivot bracket 212 is biased towards the first orientation via a spring 242 coupled between the pivot bracket 212 and the support bracket 210. In the illustrated embodiment, the spring 242 is configured as a coil spring. According to other embodiments, the spring 242 can be configured as a torsion spring or other known biasing element.

As the door 112 of the control enclosure 104 is moved from the open position (FIG. 2) towards the closed position (FIG. 3) with the power switch 114 in the OFF position, the engagement arm 232 of the door bracket 214 engages the end plate 226 on the second arm 224 of the pivot bracket 212, to pivot the pivot bracket 212 in a first direction (e.g., a clockwise direction from the perspective of FIG. 3), against the bias of the spring 242, towards the second orientation. As the pivot bracket 212 is moved into the second orientation, the first arm 222 of the pivot bracket 212 engages the defeater arm 202 to displace the defeater arm 202 into the unlocked position. In the second orientation, the first arm 222 of the pivot bracket 212 holds the defeater arm 202 in the unlocked position, until the door 112 is again opened, thereby allowing the power switch 114 to be moved between the ON/OFF positions while the door 112 is in a closed position.

Conversely, as the door 112 of the control enclosure 104 is moved from the closed position (FIG. 3) towards the open position (FIG. 2) with the power switch 114 in the OFF position, the engagement arm 232 of the door bracket 214 moves out of engagement with the end plate 226 on the second arm 224 of the pivot bracket 212. The pivot the pivot bracket 212 can then pivot in a second direction (e.g., a counter-clockwise direction from the perspective of FIG. 3), under the bias of the spring 242, towards the first orientation. As the pivot bracket 212 is moved into the first orientation, the first arm 222 of the pivot bracket 212 moves out of engagement with the defeater arm 202 to allow the defeater arm 202 to return to the locked position (e.g., under a spring bias), thereby preventing the power switch 114 from being moved from the OFF position to the ON while the door 112 is in an open position.

In the illustrated embodiment, the hook portion 230 of the door bracket 214 includes an angled leading edge 244 (see FIG. 3). According to some embodiments, the leading edge 244 of the door bracket 214 can engage the defeater arm 202 to move the defeater arm in a downwards direction (e.g. from the perspective of FIG. 3) towards the unlocked position.

In some embodiments, however, it may be useful to avoid such engagement between a door bracket and a defeater arm. For example, the inward movement of a closing door can impart a significant force component onto a defeater arm that is not aligned with the primary direction of movement of the defeater arm. This may be particularly true in installations in which a defeater arm extends for a substantial distance between a power disconnect and a relevant door. For example, as the door 112 closes, contact between the angled leading edge 244 may tend to impart force on the defeater arm 202 with a substantial force component that is perpendicular to the primary up-and-down direction of movement of the defeater arm 202. As generally noted above, this misalignment of forces may sometimes tend to deform the defeater arm 202 out of a preferred operational orientation, particularly for extended defeater arms (e.g., as in multi-bay enclosures).

To avoid this issue, in some implementations, a door bracket may be configured to move a defeater arm only indirectly. For example, as also discussed above, the door bracket 214 generally causes the defeater arm 202 to rotate via intervening engagement, by both components, with the pivot bracket 212. Thus, for example, the force of the closing door can be translated by the pivot bracket 212 into a force on the defeater arm 202 that is primarily (e.g., 70% or more) aligned with a direction of movement of the defeater arm 202 between the locked and unlocked positions.

In the illustrated embodiment, the movement of the pivot bracket 212 between the first and second orientations defines a rotation about the pivot point 220 between about 10 degrees and about 90 degrees. According to some embodiments, the movement of the pivot bracket 212 between the first and second orientations defines a rotation of between about 15 degrees and about 60 degrees, or other angular ranges. For example, in the illustrated embodiment, the movement of the pivot bracket 212 between the first and second orientations defines a rotation of about 45 degrees. Other angular ranges are also possible such that a pivot bracket engages a defeater arm.

In the illustrated embodiment, when the door 112 is in the closed position, the pivot bracket 212 and the door bracket 214 are arranged parallel to each other. That is, each of the pivot bracket 212 and the door bracket 214 define substantially planar components, such that the substantially planar components are parallel to each other with the door 112 in a closed position. In the illustrated embodiment, the axis of rotation of the pivot bracket 212 is parallel to the axis of rotation of the power switch 114. That is, the pivot bracket 212 rotates about a first axis perpendicular to the page (e.g., in and out of the page, from the perspective of FIGS. 2 and 3), and the power switch rotates about a second axis that is parallel to the first axis. In the illustrated embodiment, when the door 112 is near the close position, the door bracket 214 translates in a direction that is substantially orthogonal to the first axis about which the pivot bracket 212 rotates.

Figure 4:
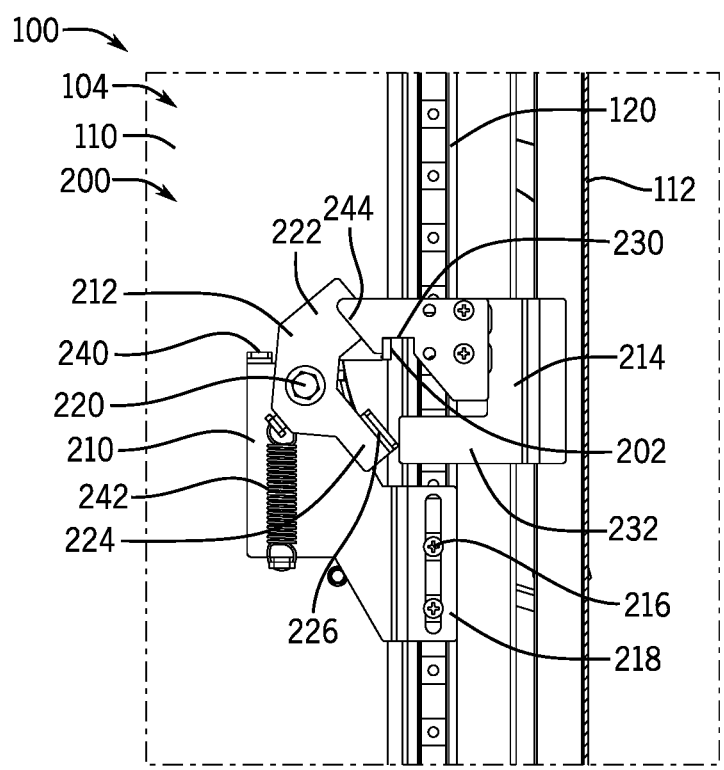
FIG. 4 is an internal view of the interlock of FIG. 2 engaging a defeater arm to prevent the door of the enclosure from opening.

As also noted above, some embodiments of the disclosed interlock system can also be configured to help prevent a door from being opened while the relevant enclosure (or bay) is energized. For example, referring now to FIG. 4, the hook portion 230 of the door bracket 214 is configured to capture the defeater arm 202 to inhibit the door 112 from becoming substantially open when the power switch is in the ON position. For example, as illustrated in FIG. 4, although the door may be permitted some movement up until the point that the door bracket 214 captures the defeater arm 202, such that a small gap may be created between the door 112 and the control cabinet 110, access to the interior is still prevented as the small gap is not sufficient to provide access to the interior of the enclosure. In that way, such a position (e.g., as shown in FIG. 4) is still considered a closed position. In other embodiments, no small gap may exist between the door 112 and the control cabinet 110 when the door bracket 214 captures the defeater arm 202.

In the illustrated embodiment, as the door 112 is moved from the closed position to the open position, the engagement arm 232 of the door bracket 214 moves away from the end plate 226 on the second arm 224 of the pivot bracket 212, thereby allowing the pivot bracket 212 to pivot from the second orientation towards the first orientation in the second direction (e.g., a counter-clockwise direction from the perspective of FIG. 4), as assisted by the spring 242. As the pivot bracket 212 rotates towards the first orientation, the first arm 222 of the pivot bracket 212 disengages the defeater arm 202 to permit movement of the defeater arm 202. However, the defeater arm 202 is spring-biased upwards (e.g., according to known power disconnect designs) and thereby move upward, as permitted by the movement of the pivot bracket 212, to be engaged by the hook portion 230 of the door bracket 214. Thus, as an operator attempts to open the door 112, the resulting movement of the pivot bracket 212 generally allows the defeater arm 202 to move into locking engagement with the door 112 and thereby generally prevent the door 112 of the control enclosure 104 from being opened.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

We claim:

1. An interlock system for an enclosure including a door movable to provide access to an interior of the enclosure, the system comprising:
   a power switch movable between an OFF position and an ON position;
   a defeater arm coupled to the power switch;
   the defeater arm extending within the interior of the enclosure and selectively movable between a locked position and an unlocked position, wherein when the defeater arm is in the locked position the power switch is prevented from moving from the OFF position to the ON position;
   a support bracket within the interior of the enclosure;
   a door bracket coupled to the door of the enclosure and including a hook; and
   a pivot bracket pivotally supported by the support bracket within the interior of the enclosure and movable between a first orientation, in which a first arm of the pivot bracket is out of engagement with the defeater arm, and a second orientation, in which the first arm of the pivot bracket displaces the defeater arm into the unlocked position,
   wherein when the door is moved into a closed position from an open position, the door bracket displaces the pivot bracket into the second orientation via engagement between the door bracket and a second arm of the pivot bracket.

2. The system of claim 1, wherein when the power switch is in the ON position and the door is moved towards the open position from the closed position, the pivot bracket is moved into the first orientation to permit the defeater arm to be captured by the hook of the door bracket such that the door is prevented from being opened.

3. The system of claim 1, wherein when the power switch is in the OFF position and the door is moved to the open position from the closed position, the door bracket moves out of engagement with the second arm of the pivot bracket so that the pivot bracket is permitted to move into the first orientation to permit the defeater arm to move into the locked position.

4. The system of claim 1, wherein the pivot bracket is biased towards the first orientation via a spring coupled between the pivot bracket and the support bracket.

5. The system of claim 1, wherein the defeater arm is spring-biased towards the locked position with the power switch in the ON position.

6. The system of claim 1, wherein the support bracket includes a tab configured as an end stop, wherein the pivot bracket is in engagement with the end stop when the pivot bracket is in the first orientation.

7. The system of claim 1, wherein the first arm and the second arm are substantially orthogonal to each other.

8. The system of claim 1, wherein movement of the pivot bracket between the first orientation and the second orientation defines a rotation of between about 15 degrees and about 60 degrees.

9. The system of claim 8, wherein movement of the pivot bracket between the first orientation and the second orientation defines a rotation of about 45 degrees.

10. An interlock system for an enclosure including a door movable to provide access to an interior of the enclosure, the system comprising:
    a power switch movable between an OFF position and an ON position;
    a defeater arm coupled to the power switch;
    the defeater arm extending into the interior of the enclosure and selectively movable between a locked position and an unlocked position, wherein when the defeater arm is in the locked position the power switch is prevented from moving from the OFF position to the ON position;
    a first bracket pivotally secured within the interior of the enclosure; and
    a second bracket coupled to the door of the enclosure, the second bracket including a hook and an engagement arm;
    wherein, when the door is in a closed position, the engagement arm of the second bracket engages the first bracket such that the first bracket is pivoted to hold the defeater arm in the unlocked position; and
    wherein, when the power switch is in the ON position and the door is moved from the closed position to an open position, the engagement arm permits the first bracket to pivot such that the defeater arm moves to be engaged by the hook.

11. The system of claim 10, wherein, when defeater arm is engaged by the hook of the second bracket, the door is prevented from being opened.

12. The system of claim 10, wherein, when the power switch is in the OFF position and the door is moved from the closed position to the open position, the engagement arm of the second bracket moves out of engagement with the first bracket and the first bracket is permitted to release the defeater arm to permit the defeater arm to move into the locked position.

13. The system of claim 10, wherein, when the door is moved from the open position to the closed position, the engagement arm engages the first bracket to rotate the first bracket in a first direction, and
    wherein the first bracket is biased in an opposing second direction via a spring coupled to the first bracket.

14. The system of claim 10, wherein the defeater arm is spring-biased towards the locked position with the power switch in the ON position.

15. The system of claim 10, wherein the first bracket is pivotally coupled to a support bracket within the interior of the enclosure.

16. The system of claim 15, wherein the support bracket includes a tab configured as an end stop, wherein the first bracket is in engagement with the end stop when power switch is in the OFF position and the door is in the open position.

17. The system of claim 10, wherein the first bracket includes a first arm and a second arm, wherein the first arm is configured to engage the defeater arm and the second arm is configured to be engaged by the engagement arm of the second bracket.

18. The system of claim 17, wherein the first arm and the second arm of the first bracket are substantially orthogonal to each other.

19. A method of controlling access to an interior of an enclosure having powered electrical components in the interior that are accessible by a door, the method comprising:
    moving the door to a closed position so that a first bracket that is pivotally secured within the interior of the enclosure is pivoted in a first direction by an engagement arm of a second bracket coupled to the door, to hold in an unlocked position a defeater arm that is coupled to a power switch that is movable between an OFF position and an ON position, the defeater arm extending into the interior of the enclosure and being movable between a locked position, in which the power switch is prevented from moving from the OFF position to the ON position, and the unlocked position, in which the power switch is permitted to move from the OFF position to the ON position;

with the door in the closed position, moving the power switch to the ON position; and with the power switch in the ON position, moving the door from the closed position towards an open position, such that the defeater arm moves to be engaged by a hook of the second bracket to prevent the door from moving to the open position.

20. The method of claim 19, further comprising:

with the door in the closed position, moving the power switch to the OFF position; and with the power switch in the OFF position, moving the door from the closed position to the open position, such that the engagement arm of the second bracket permits the first bracket to pivot under biasing force in a second direction and the first bracket moves out of engagement with the defeater arm to place the defeater arm in the locked position.

* * * * *